United States Patent [19]

Inokuchi et al.

[11] Patent Number: 5,126,277
[45] Date of Patent: Jun. 30, 1992

[54] METHOD OF MANUFACTURING A SEMICONDUCTOR DEVICE HAVING A RESISTOR

[75] Inventors: Kazuyuki Inokuchi; Yoshiaki Sano, both of Tokyo, Japan

[73] Assignee: Oki Electric Industry Co., Ltd., Tokyo, Japan

[21] Appl. No.: 361,958

[22] Filed: Jun. 6, 1989

[30] Foreign Application Priority Data

Jun. 7, 1988 [JP] Japan .................. 63-140127

[51] Int. Cl.$^5$ ..................................... H01L 21/265
[52] U.S. Cl. .......................... 437/17; 437/22; 437/46; 437/918; 148/DIG. 136
[58] Field of Search ............ 437/17, 22, 46, 918; 148/DIG. 136

[56] References Cited

U.S. PATENT DOCUMENTS

| | | | |
|---|---|---|---|
| H,147 | 11/1986 | Feldman et al. | 357/47 |
| 3,796,929 | 3/1974 | Nicholas et al. | 317/235 R |
| 3,897,273 | 7/1975 | Marsh et al. | 437/22 |
| 3,925,106 | 12/1975 | Ku et al. | 148/1.5 |
| 3,929,512 | 12/1975 | Nicholas et al. | 148/1.5 |
| 3,936,321 | 2/1976 | Shinoda | 437/22 |
| 4,298,401 | 11/1981 | Nuez et al. | 437/918 |
| 4,469,527 | 9/1984 | Sugano et al. | 437/17 |
| 4,539,743 | 9/1985 | Anthony et al. | 437/22 |
| 4,851,359 | 7/1989 | Boudou et al. | 437/24 |

FOREIGN PATENT DOCUMENTS

| | | | |
|---|---|---|---|
| 0165538 | 12/1985 | European Pat. Off. | 437/22 |
| 0231703 | 8/1987 | European Pat. Off. | |
| 2117977 | 7/1972 | France | |
| 53-19778 | 2/1978 | Japan | 437/22 |
| 55-46522 | 4/1980 | Japan | 437/46 |
| 57-133661 | 8/1982 | Japan | 437/46 |

OTHER PUBLICATIONS

Gallium Arsenide for Devices and Integrated Circuits, Proceedings of the 1986 UWIST GaAs School, Peter Peregrinus Ltd., pp. 272-275.
"Temperature Characteristics of GaAs Digital Integrated Circuits Using DCFL" (Ichioka et al., Technical Report SSD85-134, The Institute of Electronics and Comm. Engineers of Japan, pp. 45-52, Jan. 22, 1986).
Pouysegur et al, "Origin of 1/f3/2 Noise in GaAs Thin-Film Resistors and MESFET'S", *IEEE Transactions on Electron Devices*, vol. ED-34, No. 10, Oct., 1987, p. 2179

*Primary Examiner*—Olik Chaudhuri
*Assistant Examiner*—Ourmazd S. Ojan
*Attorney, Agent, or Firm*—Edward D. Manzo

[57] ABSTRACT

After doping a conductive layer made of a semiconductive material with impurites, a conductive layer with a deep trap level is formed by low temperature annealing. For forming such a conductive layer with a deep level, lattice defects are introduced into a conventional conductive layer through ion implantation and after that, only stable lattice defects, that can work as deep levels, remain by annealing at low temperature.

10 Claims, 2 Drawing Sheets

METHOD OF MANUFACTURING A SEMICONDUCTOR DEVICE HAVING A RESISTOR

BACKGROUND OF THE INVENTION

The present invention relates to a method for manufacturing a semiconductive resistor using a conductive layer in a semiconductor.

Various semiconductor integrated circuits are used as components in electronic equipment. It is well known that such an integrated circuit has functional elements made of various semiconductive materials. In forming such functional elements, conductive layers are formed, for example, by impurity ion implantation or by deposition of semiconductive materials containing some impurities. In this specification, a part of the conductive layer is to be used as a resistor.

Conventionally, though silicon(Si) has been used most widely as such a semiconductive material, gallium-arsenide(GaAs) has gradually become popular, and more and more studies have recently been made on semiconductive resistors using GaAs, where the electron mobility is around 5 to 10 times faster than in silicon(Si).

For example, *"TEMPERATURE CHARACTERISTICS OF GaAs DIGITAL INTEGRATED CIRCUITS USING DCFL"*(Ichioka et al., Technical Report SSD85-134, The Institute of Electronics and Communication Engineers of Japan, pages 45-52, Jan. 22, 1986) discloses various elemental characteristics versus temperature in case of a digital logic circuit formed using GaAs.

This article also discloses, for instance, resistance changes of a semiconductive resistor formed by disposing an ohmic electrode on a conductive layer containing n-type impurity which is formed on a semi-insulative GaAs crystalline substrate on various temperature conditions. According to the measurement results, the resistance temperature coefficient becomes +1300 ppm/°C. around room temperature (measured at between −40° to +80° C.), and is positive going with increasing sheet resistance. It is considered that such resistance changes with positive temperature coefficients are due to the following reasons: and donor or acceptor with a certain shallow level, which generates carriers, generally releases the carriers around room temperature, and is virtually ionized. In such a case, resistivity "$\rho$" can be formulated with carrier density "n", unit charge "e", and mobility "$\mu$" as follows:

$$\rho = \frac{1}{en\mu}$$

As recognized from the above formula, when the resistance temperature coefficient is positive going, only mobility temperature coefficient varies with negative values, namely, mobility "$\mu$" becomes smaller with rising temperature. That is, in the above formula, it is seemed that unit electron charge "e" and carrier density "n" are virtually invariants in a conductive layer with a shallow level (impurity) as a sufficient stable state, and only mobility "$\mu$" contributes to resistance changes proportional to resistivity "$\rho$".

Such conventional conductive layers with impurity levels, which constitute conventional semiconductive resistors, have the following disadvantages:

1) When a semiconductive layer is formed of a single semiconductive material, resistance temperature coefficients are obtained only as values inherent to each material though such coefficients depend on its resistivity, according to a conventional method. However, electronic circuits are normally desired to maintain some predetermined performances within wide scope of temperature. That is, in designing circuits, it is desirable to make different types of circuits of a single semiconductive material depending on required cases, that is, whether it is not preferable for semiconductive resistors, provided as various functional elements, to change their resistance values according to temperature environment by operation, or it is preferable for such resistors to change their resistance values, with a certain rate of change (temperature coefficient) determined by each design, following the change of temperature environment. In other words, if GaAs is used, as an example of such single semiconductive material mentioned above, resistance temperature coefficients are positive and no negative coefficients and zero "0" can be obtained in conventional methods.

2) As disclosed in the above mentioned document, when GaAs is used as a semiconductive material, it is easy to form a conductive layer by conventional ion implantation with sheet resistance less than around 200 ($\Omega/\square$). However, to achieve higher value of sheet resistance than 200 ($\Omega/\square$), as shown from the formula above, it is necessary either to decrease the carrier density "n" by reducing density of impurity to be implanted, or to make the conductive layer itself thinner. When a semiconductive resistor is formed by such methods, there remain such problems as poor repeatability for resistance value due to the existence of depletion layers on the surface of the conductive layer, and high current dependency of sheet resistance.

SUMMARY OF THE INVENTION

It is an object of the present invention to provide a method for manufacturing a semiconductive resistor, where the resistance temperature coefficient can be set at a prescribed value, selected from a range of values above and below zero as desired, in order to solve the above mentioned problems.

To achieve the foregoing object, the present invention provides a method for manufacturing a semiconductive resistor comprising steps of:

establishing by ion implantation for example, impurities in a conductive layer made of a semiconductive material; and annealing said conductive layer at a low temperature to have a deep trap level(relative to the conduction band).

According to a method for manufacturing a semiconductive resistor of the present invention, in forming a conductive layer with the deep trap level, lattice defects are introduced into a conventional conductive layer illustratively by ion implantation, and then, by annealing at a relatively low temperature, only stable lattice defects, which have deep trap levels, can remain.

Thus, according to the semiconductive resistor made by a manufacturing method of the present invention, in a conventional conductive layer with a shallow trap level as a donor which provides carriers, or as an acceptor, a conductive layer is provided with a deep trap level to trap and release, and scatter the carriers. In such conductive layer with a deep trap level, the probability for releasing carriers, caught in the deep trap level, into the conduction band becomes higher. For that, temperature coefficient as to carrier density "n" is positive and increasing with rising temperature, and to rising resistivity "ρ", inversely proportional to the carrier density. A negative temperature coefficient element can be achieved as a whole if desired.

The above objects, features and advantages of the present invention will become apparant from the following description taken in conjunction with the accompanying drawings.

DETAILED DESCRIPTION OF THE PREFERRED EMBODIMENT

Figure 1:
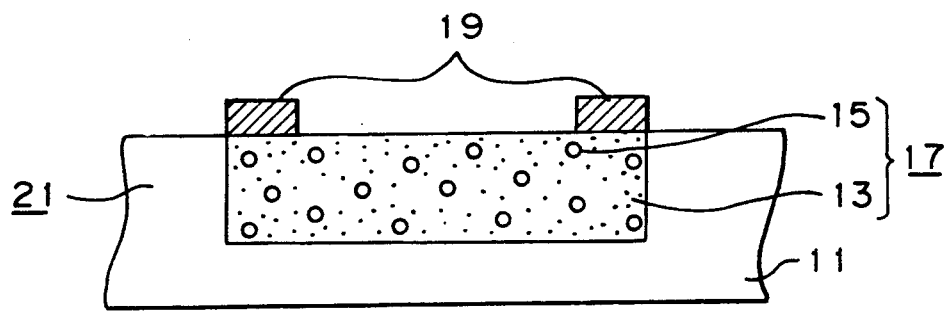
FIG. 1 is a cross sectional view illustrating briefly a semiconductive resistor formed according to an embodiment of the present invention.

An embodiment of the present invention will be explained referring to the drawings from FIG. 1 through FIG. 4, using GaAs as a semiconductive material for forming a semiconductive resistor, for example. Although the following explanation will be made by specifying certain materials and numerical conditions in order to be understood easily, the present invention should not be limited to the following embodiment, but can also be adapted to various modifications of the subject matter of the present invention.

FIG. 1 is a schematic cross sectional view illustrating a semiconductive resistor formed according to an embodiment of the present invention. In the following description, "wafer" is used in a comprehensive sense.

First, using a resist mask pattern formed on a substrate 11 of semi-insulative GaAs, silicon(Si) is ion-implanted on such conditions that the acceleration energy is 100 KeV and the sheet ion density is about $1.5 \times 10^{13}$ cm$^{-2}$. Thereafter, as in a conventional way, high temperature annealing around 800° C. is performed for 20 minutes so that damaged defects caused by ion implantation car be cured and so that the Si ion can be activated to work as a donor, whereby a conventional conductive layer with a shallow trap level 13 is formed.

Next, using a resist mask pattern in the same manner of the above process, a second doping occurs where Si is ion-implanted into a plurality of wafers having such a conductive layer 13, again, on such conditions that the acceleration energy is 100 KeV as above and the sheet density is selected within the range of $2 \times 10^{10}$ to $7.5 \times 10^{10}$ cm$^{-2}$. In order to keep the depth of lattice defects to be almost the same level as that obtained by the above process, the acceleration energy is determined to have the same value as that of the above process.

Subsequently, a second annealing is performed to each of wafers 11 ion-implanted with various sheet densities mentioned above. The second annealing is done at any low temperature within the second range of around 300° to 400° C. for 5 minutes and lattice defects 15 with deep trap levels, which work as resistors stably, are introduced into the above mentioned conductive layer 13 to form a conductive layer with a deep level 17.

After that, for evaluating the various characteristics mentioned below, ohmic electrodes 19, consisting of three layers: Gold-Germanium (Au-Ge), Nickel (Ni) and Gold (Au), are formed at the end portion of the conductive layer with the deep level 17 of the substrate of the wafer 11 so that a semiconductive resistor 21 is obtained as shown in FIG. 1.

Characteristics of a semiconductive resistor formed according to a method of the present invention have been evaluated comparing to a conventional semiconductive resistor which has been made without the second ion implantation for introducing the deep levels. Now, the result of such characteristic evaluations are described in detail below:

1. The impurity density relative to the sheet resistance of a conductive layer with a deep level First, using a semiconductive resistor obtained from above mentioned processes as a sample, impurity densities and sheet resistances have been measured to evaluate the effect of the second ion implantation for introducing deep levels.

Figure 2:
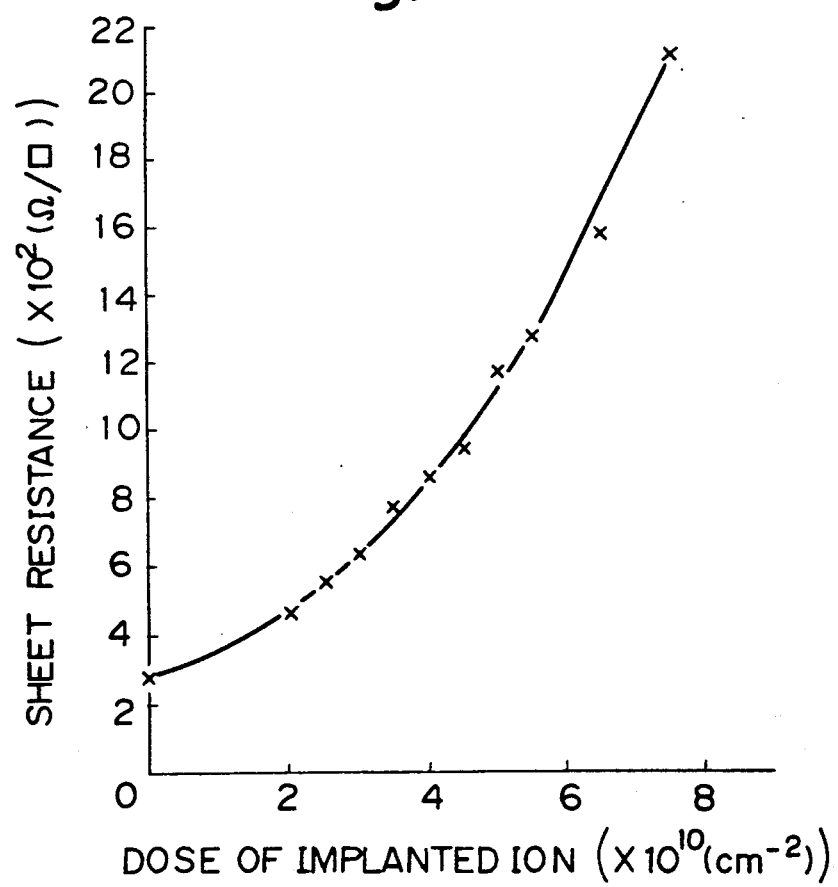
FIG. 2 is a diagram showing a characteristic curve of dose of implanted impurity ion to form conductive layers with a deep level versus the sheet resistance.

FIG. 2 shows a characteristic curve in which the vertical axis represents the sheet resistance ($\times 10^2$ Ω/□), and the horizontal axis represents the dose of implanted ion resistance($\times 10^{10}$ cm$^{-2}$). For a conventional semiconductive resistor, the sheet resistance is around 270 Ω/□. Comparing to that, as shown in FIG. 2, for a semiconductive resistor 21 having a conductive layer with a deep level formed according to the present invention, higher sheet resistances can be obtained by introducing the deep levels with dose level within the range of $2 \times 10^{10}$ to $7.5 \times 10^{10}$ cm$^{-2}$. When the sheet density is set to $7.5 \times 10^{10}$ cm$^{-2}$, the sheet resistance was observed to be 2,100 Ω/□.

2. The sheet resistance relative to the resistance temperature coefficient

Next, using a semiconductive resistor obtained from above mentioned processes as a sample, sheet resistances and resistance temperature coefficients have been measured.

Figure 3:
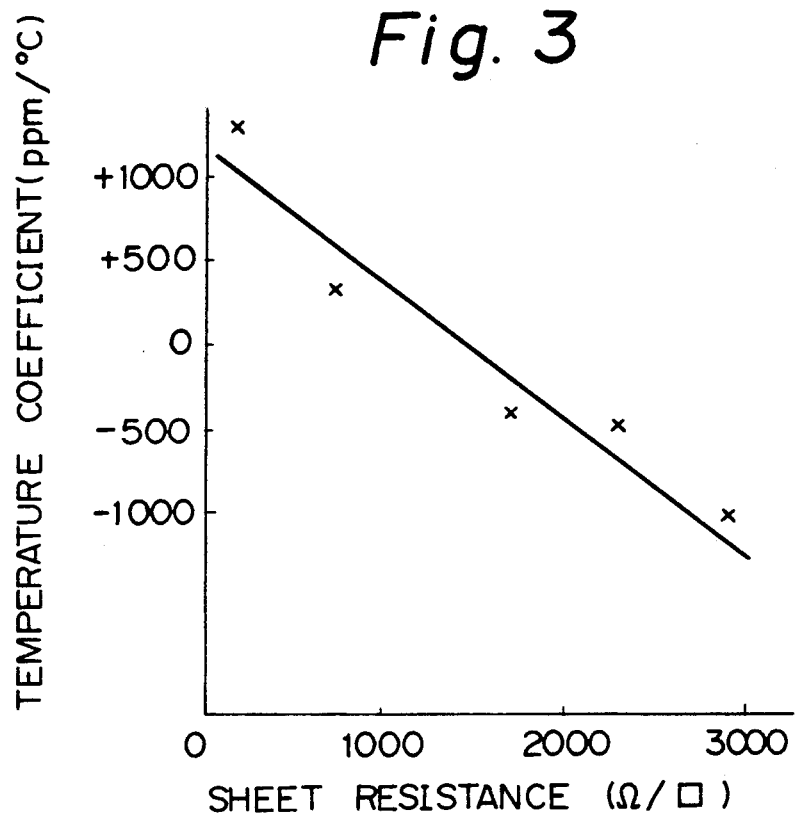
FIG. 3 is a diagram showing a characteristic curve of the sheet resistance versus the resistance temperature coefficient.

FIG. 3 shows a characteristic curve in which the vertical axis represents the temperature coefficient ppm/°C. and the horizontal axis represents the sheet resistance Ω/□.

As shown in FIG. 3, when the sheet resistance of a semiconductive resistor formed with a deep level is selected within the range around 200 to 2,900 Ω/□, a linear relation is recognized, that is, the sheet resistances are nearly inversely proportional to the resistance temperature coefficients. Namely, in implementing a method of the present invention, by controlling the sheet density for the second ion implantation, its temperature coefficient can be selected to any value within the range around +1,300 to −1000 ppm/°C., either positive, negative, or zero. Particularly, when the sheet resistance is set to approximately 1,500 Ω/□(corresponding to the case when the dose of implanted ion is approximately $6 \times 10^{10}$ cm$^{-2}$), the resistance temperature coefficient reveals zero(0).

3. The sheet resistance and the current dependency

Next, changes of the sheet resistance according to the current quantities have been measured when current is actually flowing in a semiconductive resistor. In this measurement, a semiconductive resistor according to the present invention with the sheet resistance around 2,000 Ω/□ has been used as a sample, and a conventional semiconductive resistor has been also used for the purpose of making a comparison with said sheet resistance obtained by reducing the sheet density of a donor with a shallow level.

Figure 4:
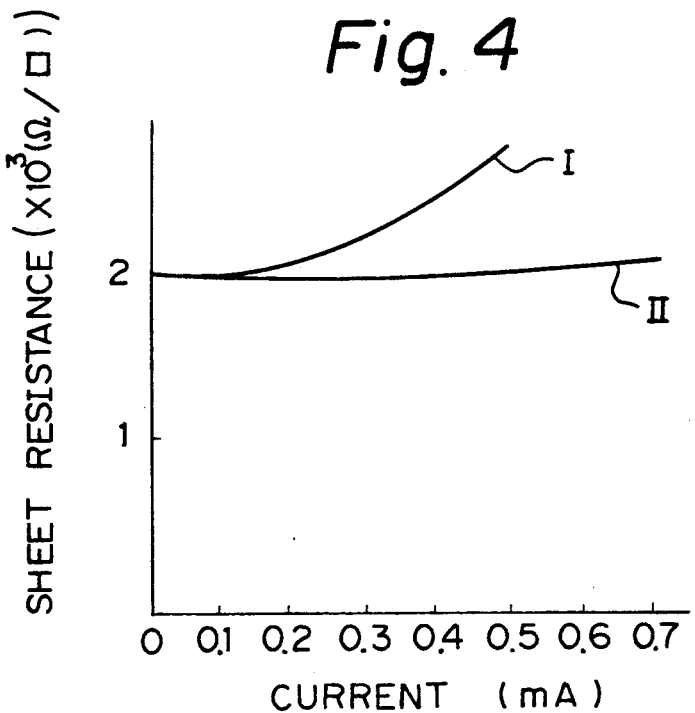
FIG. 4 is a diagram showing a characteristic curve of the current flowing through the semiconductive resistor versus the sheet resistance.

FIG. 4 shows characteristic curves in which the vertical axis represents the sheet resistance ($\times 10^3$ Ω/□) and the horizontal axis represents the current (mA). Curve I represents the measurement result of a conventional semiconductive resistor, and Curve II represents the measurement result of a semiconductive resistor according to the present invention.

As recognized from Curve I in FIG. 4, the conventional semiconductor resistor reveals increment of the sheet resistance from 0.1 mA approximately, influenced by the depletion layer generated beneath the conductive layer. On the other hand, Curve II shows that, for a semiconductive resistor composed of a conductive layer with a deep level, the sheet resistance can be kept almost fixed value, within the measurement current range. Furthermore, in a semiconductive resistor formed according to the present invention, since the lattice defects density with deep levels becomes not less than 80% comparing to the impurity donor density, the depletion layer can not be expanded from the surface contrary to a conductive layer with only donor impurity so that the current dependency on the sheet resistance can be almost fixed.

As described above, although the present invention has been explained with regard to a specific embodiment, the present invention is not limited to the above embodiment.

For example, considering electron energy at room temperature (300° K.) is around 26 meV, a semiconductive resistor according to the present invention, referred in the above embodiment, has been so composed that its deep level of a conductive layer is set to be not less than 0.2 eV. And it has been explained that, in order to form such deep levels, lattice defects can be introduced by ion implantation, and low temperature annealing has been employed in order that merely such defects as can work as a stable element can remain unchanged.

However, it is clearly recognized that for forming such semiconductive resistors, instead of the ion implantation, there are other methods, for example, for making lattice defects by X-ray, α-ray or any other beams, a method for introducing any transition metal which works as a deep level by ion implantation or by diffusion, or a method for introducing defects in accordance with stoichiometry differences between compound semiconductive materials made of heteroatoms.

Further, as semiconductive materials which are permitted to introduce deep levels by these lattice defects, not only GaAs, but also silicon(Si), indium-phospohrus-(InP) and any other various materials are applicable.

Moreover, the above mentioned embodiment has shown the case of a conductive layer with a deep level which works as a trap for electrons, being formed in a conventional n-type conductive layer, that is, the case in which lattice defects with deep levels exist near a forbidden band apart from a conduction band. However, in case of a p-type conductive layer, lattice defects with deep levels which exist near a valence band apart from a forbidden band can be introduced as a conductive layer with a deep level which works as a hole trap can be employed in a similar low temperature annealing process.

In addition, since the semiconductor resistor shown in FIG. 1 is a mere sample for evaluation, even if various component elements are provided as actual integrated circuits, such elements have clearly the same performance characteristics.

These materials, numeric conditions, disposition, and any other specific conditions described above are not limited to the above embodiment, but also adapted to various modifications within the scope of the subject matter of the present invention.

What is claimed is:

1. A method of manufacturing a resistor in a GaAs substrate comprising the steps of:
   (a) implanting silicon ions into a region of the GaAs substrate with a sheet density of about $1.5 \times 10^{13}$ cm$^{-2}$ and an acceleration energy of about 100 KeV;
   (b) annealing said GaAs substrate at about 800° C. to cure lattice defects caused by said implantation and to activate said silicon ions so that said region becomes a conductive layer having a shallow impurity level;
   (c) implanting silicon ions into said conductive layer with a sheet density of $2 \times 10^{10}$ to $7.5 \times 10^{10}$ cm$^{-2}$ and an acceleration energy of about 100 KeV to cause lattice defects in said conductive layer; and
   (d) annealing said substrate at a temperature in the range of about 300° C. to 400° C. to form a deep trap level in said conductive layer.

2. The method of claim 1 wherein said second-named annealing step is performed for 5 minutes.

3. A method of manufacturing a resistor in a gallium arsenide substrate comprising the steps of:
   (a) implanting ions into a region of the substrate with a first sheet density and a first acceleration energy;
   (b) annealing said substrate at about 800° C. to cure lattice defects caused by said implantation and to activate said ions so that said region becomes a conductive layer having a shallow
   (c) implanting further ions into said conductive layer with a second sheet density lower than said first sheet density to cause lattice defects in said conductive layer; and
   (d) annealing said substrate at a temperature range lower than 800° C. to form a deep trap level in said conductive layer.

4. A method of manufacturing a resistor in a gallium arsenide substrate comprising the steps of:
   (a) introducing donor or acceptor impurities into a region of the substrate to cause lattice defects therein;
   (b) annealing said substrate at a relatively high temperature to cure said lattice defects and activate said impurities so that said region contains a shallow impurity level;
   (c) introducing further lattice defects into said region to cause lattice defects therein; and
   (d) annealing said substrate at a relatively lower temperature than said relatively high temperature to form a deep trap level in said region.

5. The method of claim 4 wherein said step (a) of introducing lattice defects includes a first ion implantation step and wherein said step (c) includes a second ion implantation step.

6. The method of claim 5 wherein both of said ion implantation steps are performed at substantially the same implantation energy.

7. The method claim 6 wherein said first ion implantation is performed to a sheet density orders of magnitude greater than the second implantation density.

8. The method of claim 7 wherein said first ion implantation occurs to a sheet density of substantially $1.5 \times 10^{13}$ cm$^{-2}$.

9. The method of claim 7 wherein said second ion implantation occurs to a sheet density in the range substantially of $2 \times 10^{10}$ cm$^{-2}$ to $7.5 \times 10^{10}$ cm$^{-2}$.

10. The method of claim 9 wherein said implantation steps employ silicon ions.

* * * * *